United States Patent
Sabouri

(10) Patent No.: US 8,933,858 B2
(45) Date of Patent: Jan. 13, 2015

(54) FRONT END PARALLEL RESONANT SWITCH

(75) Inventor: Faramarz Sabouri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 205 days.

(21) Appl. No.: 13/570,895

(22) Filed: Aug. 9, 2012

(65) Prior Publication Data

US 2014/0043203 A1    Feb. 13, 2014

(51) Int. Cl.
| H01Q 1/50 | (2006.01) |
| H01Q 1/24 | (2006.01) |
| H04B 1/04 | (2006.01) |
| H01Q 9/14 | (2006.01) |
| H04B 1/00 | (2006.01) |
| H03H 7/38 | (2006.01) |

(52) U.S. Cl.
CPC ............... *H01Q 1/50* (2013.01); *H01Q 1/242* (2013.01); *H04B 1/0458* (2013.01); *H01Q 9/14* (2013.01); *H04B 1/0057* (2013.01); *H04B 1/006* (2013.01); *H03H 2007/386* (2013.01)
USPC .......................................... 343/860; 343/850

(58) Field of Classification Search
USPC ................................................. 343/850, 860
See application file for complete search history.

(56) References Cited

U.S. PATENT DOCUMENTS

| 5,742,897 | A | 4/1998 | Plowdrey et al. |
| 6,366,474 | B1 | 4/2002 | Gucyski |
| 6,393,264 | B1 | 5/2002 | Scholz |
| 7,088,971 | B2 * | 8/2006 | Burgener et al. .......... 455/127.1 |
| 7,869,771 | B2 | 1/2011 | Zolfaghari |
| 8,131,251 | B2 * | 3/2012 | Burgener et al. ............. 455/333 |
| 8,135,355 | B2 * | 3/2012 | Gorbachov ..................... 455/73 |
| 2004/0253939 | A1 | 12/2004 | Castaneda et al. |
| 2011/0211380 | A1 | 9/2011 | Brown |

FOREIGN PATENT DOCUMENTS

| EP | 0749199 A1 | 12/1996 |
| WO | 0207337 | 1/2002 |
| WO | 2009009646 A2 | 1/2009 |

OTHER PUBLICATIONS

International Search Report and Written Opinion—PCT/US2013/054418—ISA/EPO—Oct. 22, 2013.

* cited by examiner

*Primary Examiner* — Hoang V Nguyen
(74) *Attorney, Agent, or Firm* — Ramin Mobarhan

(57) ABSTRACT

A front end parallel resonant switch is disclosed. In an exemplary embodiment, an apparatus includes an inductor and a capacitor configured to couple a first RF transmission to an antenna, and at least one switch configured to connect the inductor to the capacitor to form a matching network when transmitting the first RF transmission from the antenna, and to connect the inductor to capacitor to form a parallel resonant circuit when transmitting a second RF transmission from the antenna.

20 Claims, 5 Drawing Sheets

FRONT END PARALLEL RESONANT SWITCH

BACKGROUND

1. Field

The present application relates generally to the operation and design of electronic circuits, and more particularly, to the operation and design of analog front ends.

2. Background

A conventional multi-band front end uses one power amplifier and a matching network. Mode switches are used to select between multiple signal paths to enable one of the multiple bands. Insertion loss from the mode switches contributes to degradation of the overall efficiency of the front end. Therefore, it is desirable to eliminate this insertion loss.

Some front ends utilize combination chips that provide multiple power amplifiers where each power amplifier drives signals in a selected band. The amplifier outputs share a common RF input/output (RFIO) terminal that couples the amplifier outputs to an antenna. Managing the loading effect of one path on the other paths is a major challenge.

Accordingly, a novel front end parallel resonant switch is disclosed that allows switching between multiple power amplifier outputs while controlling the loading effects of one transmit path on other transmit paths.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
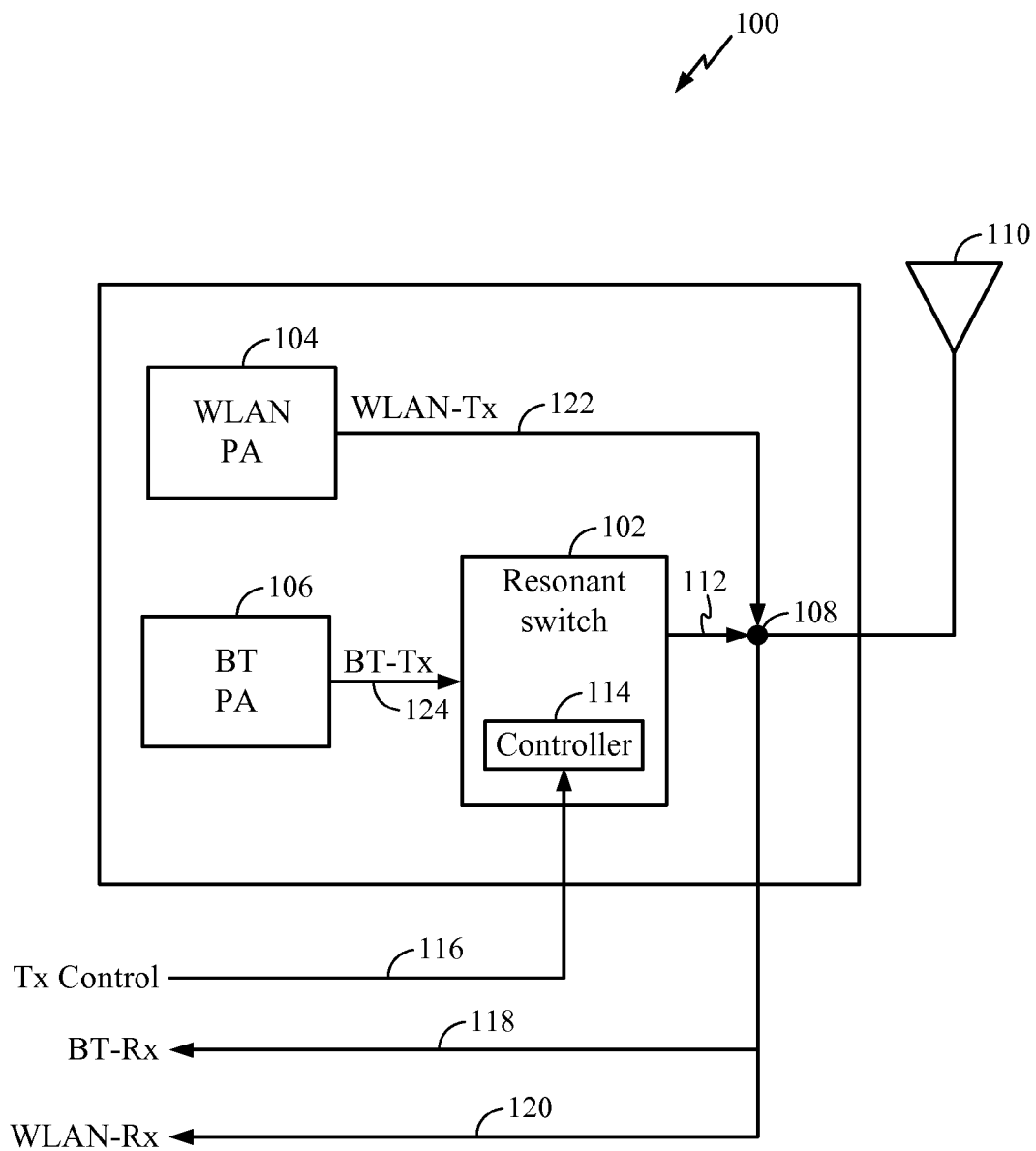
FIG. 1 illustrates an exemplary embodiment of a front end comprising a novel parallel resonant switch.

FIG. 1 illustrates an exemplary embodiment of a front end 100 comprising a novel parallel resonant switch 102. For example, the front end 100 is suitable for use in a wireless device. The front end 100 comprises a WLAN power amplifier (PA) 104 that outputs a WLAN transmit (Tx) signal 122 and a Bluetooth (BT) power amplifier 106 that outputs a BT Tx signal 124. The WLAN-Tx signal 122 is received at an RFIO terminal 108, which is further connected to antenna 110. The BT-Tx signal 124 is received at the parallel resonant switch 102, which outputs a switch output signal 112 that is also received at the RFIO terminal 108.

The resonant switch 102 comprises a controller 114 that receives a Tx mode control signal 116 from another entity at the wireless device, such as a baseband (BB) processor, and uses this Tx mode control signal 116 to generate the switch output signal 112. The RFIO terminal 108 is also coupled to receive two received (Rx) signals from the antenna (i.e., BT-Rx 118 and WLAN-Rx 120) that are passed to receiver circuitry at the wireless device. As discussed in greater detail below, the resonant switch 102 operates to switch between the two transmit signals (122 and 112) without the use of in-line mode switches to eliminate insertion loss associated with the use of in-line mode switches. The resonant switch 102 also operates to control the loading effects of one transmit signal on the other transmit signal so as to reduce signal degradation.

Figure 2:
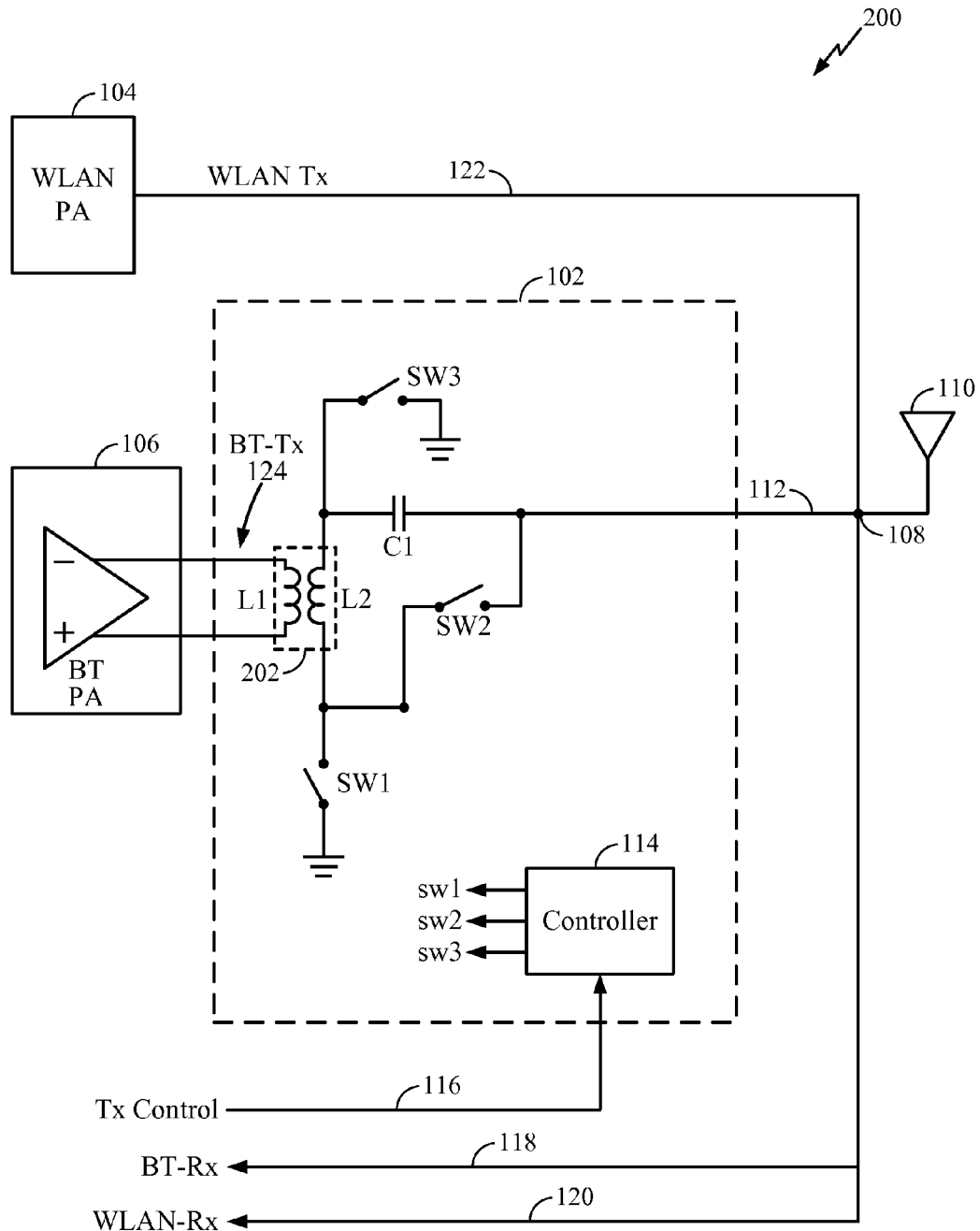
FIG. 2 shows a detailed exemplary embodiment of the resonant switch shown in FIG. 1.

FIG. 2 shows a detailed exemplary embodiment of the resonant switch 102 shown in FIG. 1. The resonant switch 102 comprises a transformer 202 having an input inductor L1 and an output inductor L2. The input inductor L1 is coupled to the BT-PA 106 that outputs the BT Tx signal 124. The inductor L2 has a first terminal connected to a first terminal of switch (SW1) and a first terminal of a second switch (SW2). The inductor L2 has a second terminal connected to a first terminal of a third switch (SW3) and a first terminal of capacitor (C1). The capacitor (C1) has a second terminal connected to a second terminal of the second switch (SW2) and outputs the switch output signal 112 that is connected to the RFIO terminal 108. The first switch (SW1) and the third switch (SW3) have second terminals connected to ground. The controller 114 outputs three switch control signals (sw1, sw2, and sw3) that operate to control (i.e., open and close) the switches SW1, SW2, and SW3. As further illustrated in FIG. 2, the RFIO terminal 108 is shared between the switch output 112, WLAN Tx 122, BT Rx 118 and WLAN Rx 120 signals.

During operation, the transformer 202 functions as a mode switch by changing a ground port location using the switches SW1 and SW3. Since the switches SW1 and SW3 are tied to ground, they contribute very little insertion loss. The controller 114 operates to generate the switch control signals (sw1, sw2, and sw3) based on the Tx mode signal 116. The Tx mode signal 116 can be set to indicate any of the following modes.

BT Transmit Mode

In BT transmit mode, the controller outputs the switch control signals (sw1, sw2, and sw3) so that only switch SW1 is closed and switches SW2 and SW3 are open. The output power of the BT Tx signal 124 is coupled to the RFIO terminal 108 through coupling cap C1. In this mode the WLAN PA 104 is in an off state and so there is no WLAN Tx signal 122 at the RFIO terminal 108. Since the SW1 switch is closed and is placed in a path to ground (rather than in the signal path) very little RF signal appears across its drain-source and it presents only a small "on" resistance providing good linearity.

WLAN Transmit Mode.

In WLAN Tx mode, the switches SW2 and SW3 are closed, the switch SW1 is open, and the BT-PA 106 is turned off. The inductor L2 and the capacitor C1 are therefore connected in parallel to form a parallel resonant circuit configured to resonate at the frequency of operation of the WLAN PA 104 to present high impedance at RFIO terminal 108. This parallel resonant circuit prevents the output power of the WLAN PA 104 from being wasted across the otherwise low output impedance associated with the transformer 202 if the switches (SW1-SW3) were not utilized. In addition, the closed switch SW3 maintains very low voltage swing across the switch, which prevents switch breakdown under the large voltage swing of the output of the WLAN PA 104.

BT or WLAN Receive Mode

In BT or WLAN receive mode, the switches SW2 and SW3 are closed and the switch SW1 is open as described above. The impedance at the RFIO terminal 108 is increased by the parallel resonant circuit formed by L2 and C1 and therefore not much Rx input power is wasted.

The exemplary embodiments described herein disclose a mechanism to share a common terminal (RFIO 108) between multiple transmit signals (122 and 112) and multiple receive signals (118 and 120), while reducing the loading effect of an enabled transmit signal on the other signals. While the loading effect is reduced, the impairment of the TX switch is reduced because the switches are not in the signal path. In summary, the switches SW1-SW3 are configured to connect the inductor L2 and the capacitor C1 to form a matching network when transmitting a first RF transmission (the output signal 112) from the antenna, and to connect the inductor L2 and capacitor C1 to form a parallel resonant circuit when transmitting a second RF transmission (the WLAN Tx signal 122) from the antenna. The parallel resonance switch 102 provides improves linearity and provides reasonably high output impedance when the BT PA 106 is not being used.

Figure 3:
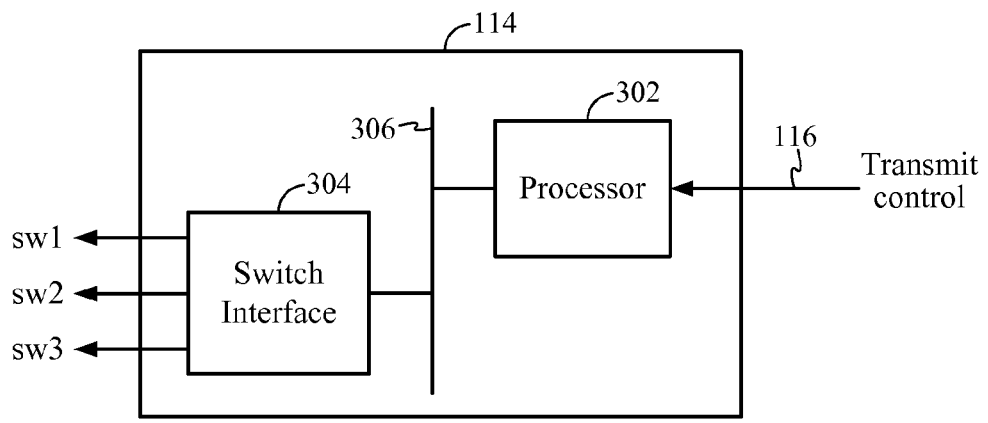
FIG. 3 shows an exemplary embodiment of a controller.

FIG. 3 shows an exemplary embodiment of the controller 114. The controller 114 comprises processor 302 and switch interface 304 both coupled to communicate over bus 306. It should be noted that the controller 114 is just one implementation and that other implementations are possible.

The switch interface 304 comprises hardware and/or hardware executing software that operates to allow the controller 114 to set the switch control signals (sw1, sw2, and sw3) to enable a particular mode of operation. For example, the switch control signals (sw1, sw2, and sw3) are set to enable of the modes of operation described above. The switch interface 304 is controlled by communicating with the processor 302 using bus 306.

The processor 302 comprises at least one of a CPU, processor, gate array, hardware logic, memory elements, and/or hardware executing software stored or embodied in a memory. The processor 302 operates to control the switch interface 304 to perform the functions described herein.

In an exemplary embodiment, the processor 302 receives the transmit mode control signal 116 from a baseband processor or other entity and operates to control the switch interface 304 based on the transmit mode control signal 116 to generate the switch control signals (sw1, sw2, sw3) so as to close and open the appropriate switches to enable a desired mode of operation as described above. For example, the following table illustrates switch positions associated with several operating modes.

| Switch | BT-Tx | WLAN-Tx | BT/WLAN Rx |
|--------|-------|---------|------------|
| SW1 | closed | open | open |
| SW2 | open | closed | closed |
| SW3 | open | closed | closed |

Figure 4:
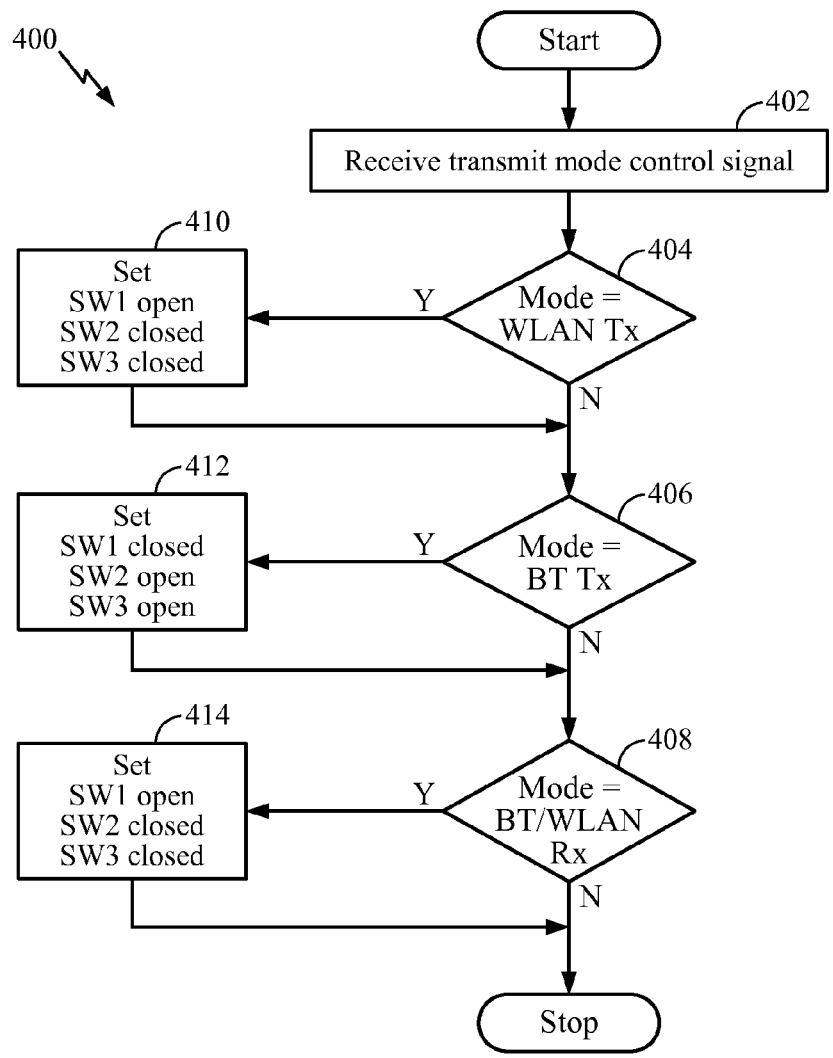
FIG. 4 shows an exemplary method for providing a parallel resonant switch to minimize insertion loss and control signal path loading.

FIG. 4 shows an exemplary method 400 for providing a parallel resonant switch to minimize insertion loss and control signal path loading. For example, the method 400 is suitable for use by the controller 114 shown in FIG. 3. In one implementation, the processor 302 executes one or more sets of codes or instructions stored or embodied in a memory to control the controller 114 to perform the functions described below.

At block 402, a transmit mode control signal is received. For example, the processor 302 receives the transmit mode control signal 116 from a baseband processor. The transmit mode control signal indicates a selected operating mode, which is to be enabled by the processor 302.

At block 404, a determination is made as to whether the transmit mode control signal indicates a WLAN Tx mode. The processor 302 makes this determination. If the transmit mode control signal indicates a WLAN Tx mode is desired, the method proceeds to block 410. If not, the method proceeds to block 406.

At block 410, the switches (SW1-SW3) are set to enable the WLAN Tx mode. In an exemplary embodiment, the processor 302 controls the switch interface 304 to set the switch control signals (sw1, sw2, sw3) so that SW1=open, SW2=closed, and SW3=closed as indicated in the mode description above.

At block 404, a determination is made as to whether the transmit mode control signal indicates a BT Tx mode. The processor 302 makes this determination. If the transmit mode control signal indicates a BT Tx mode is desired, the method proceeds to block 412. If not, the method proceeds to block 408.

At block 412, the switches (SW1-SW3) are set to enable the BT Tx mode. In an exemplary embodiment, the processor 302 controls the switch interface 304 to set the switch control signals (sw1, sw2, sw3) so that SW1=closed, SW2=open, and SW3=open as indicated in the mode description above.

At block 404, a determination is made as to whether the transmit mode control signal indicates a BT/WLAN Rx mode. The processor 302 makes this determination. If the transmit mode control signal indicates a BT/WLAN Rx mode is desired, the method proceeds to block 414. If not, the method ends.

At block 414, the switches (SW1-SW3) are set to enable the BT/WLAN Rx mode. In an exemplary embodiment, the processor 302 controls the switch interface 304 to set the switch control signals (sw1, sw2, sw3) so that SW1=open, SW2=closed, and SW3=closed as indicated in the mode description above.

Therefore, the method 400 provides a method for providing a parallel resonant switch to minimize insertion loss and control transmit signal path loading. It should be noted that the method 400 is just one implementation and that the operations of the method 400 may be rearranged or otherwise modified such that other implementations are possible.

Figure 5:
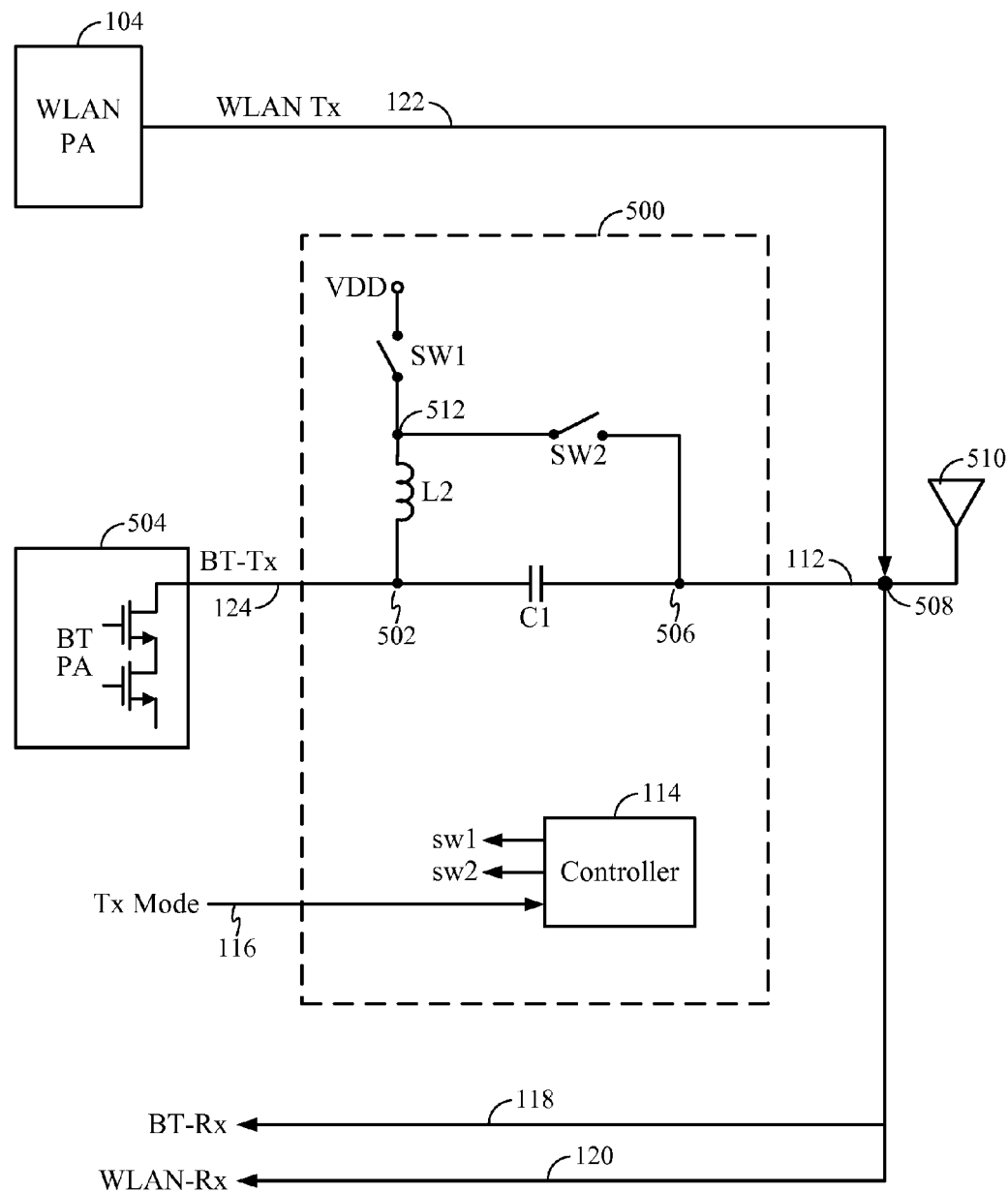
FIG. 5 shows a detailed exemplary embodiment of a parallel resonant switch for use in single-ended systems.

FIG. 5 shows a detailed exemplary embodiment of a parallel resonant switch 500 for use in a single-ended system. The resonant switch 500 comprises an inductor L2 that has a first terminal 502 connected to receive a single ended output of a BT-PA 504. The first terminal 502 is also connected to capacitor C1. An output terminal 506 of capacitor C1 outputs the switch output signal 112 that is received by an RFIO terminal 508, which is coupled to antenna 510. A second terminal 512 of the inductor L2 is connected to a first switch (SW1) that is also connected to a power source VDD. The second terminal 512 of the inductor L2 is connected to a second switch (SW2) that is also connected to the terminal 506 of capacitor C1. The controller 114 is modified to generate only two switch control signals (sw1 and sw2) based on the received Tx mode signal 116. As further illustrated in FIG.

5, the RFIO terminal 508 is shared between switch output 112, the WLAN Tx 122, the BT Rx 118 and WLAN Rx 120 signals.

During operation, the controller 114 operates to generate the switch control signals (sw1 and sw2) based on the Tx mode signal 116 in accordance with the following table.

| Switch | BT-Tx | WLAN-Tx | BT/WLAN Rx |
|--------|-------|---------|------------|
| SW1 | closed | closed | closed |
| SW2 | open | closed | closed |

Figure 6:
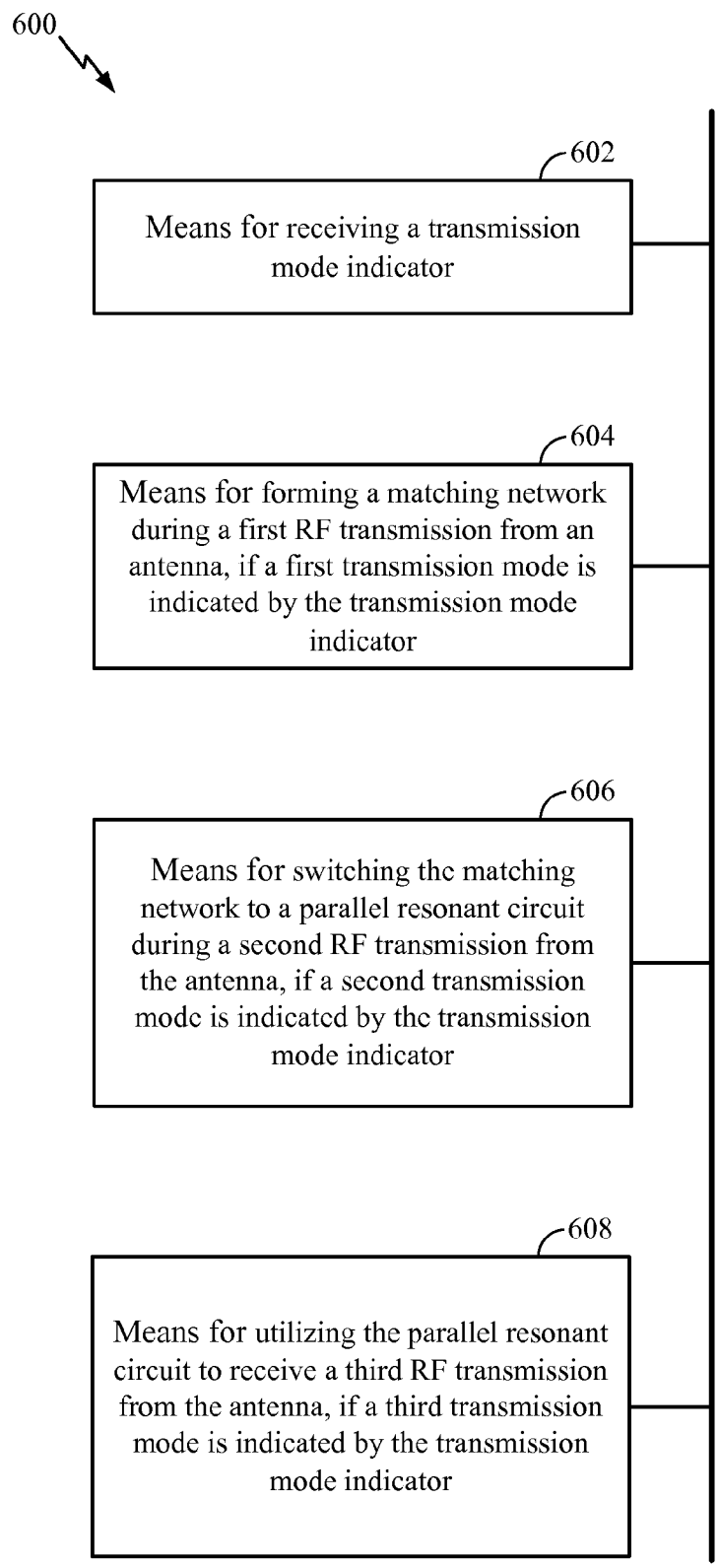
FIG. 6 shows an exemplary embodiment of a parallel resonant switch apparatus.

FIG. 6 shows an exemplary embodiment of a parallel resonant switch apparatus 600. For example, the apparatus 600 is suitable for use as the parallel resonant switch 114 having various aspects and embodiments illustrated in FIGS. 1-5. In an aspect, the apparatus 600 is implemented by one or more modules configured to provide the functions as described herein. For example, in an aspect, each module comprises hardware and/or hardware executing software.

The apparatus 600 comprises a first module comprising means (602) for receiving a transmission mode indicator, which in an aspect comprises the processor 302.

The apparatus 600 also comprises a second module comprising means (604) for forming a matching network during a first RF transmission from an antenna, if a first transmission mode is indicated by the transmission mode indicator, which in an aspect comprises the switches (SW1, SW2, and SW3).

The apparatus 600 also comprises a third module comprising means (606) for switching the matching network to a parallel resonant circuit during a second RF transmission from the antenna, if a second transmission mode is indicated by the transmission mode indicator, which in an aspect comprises the switches (SW1, SW2, and SW3).

The apparatus 600 also comprises a fourth module comprising means (608) for utilizing the parallel resonant circuit to receive a third RF transmission from the antenna, if a third transmission mode is indicated by the transmission mode indicator, which in an aspect comprises the switches (SW1, SW2, and SW3).

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
    an inductor and a capacitor configured to couple a first RF transmission and a second RF transmission to an antenna; and
    at least one switch configured to connect the inductor to the capacitor to form a matching network when transmitting the first RF transmission from the antenna, wherein the capacitor has a first capacitor terminal that is connected to the antenna, and the at least one switch configured to directly connect a first inductor terminal to the first capacitor terminal to form a parallel resonant circuit when transmitting the second RF transmission from the antenna.

2. The apparatus of claim 1, the at least one switch configured to connect the inductor to the capacitor in series to form the matching network.

3. The apparatus of claim 1, the at least one switch configured to connect the inductor to the capacitor in parallel to form the parallel resonant circuit.

4. The apparatus of claim 1, further comprising a controller configured to control the at least one switch based on a transmit mode signal.

5. The apparatus of claim 1, the inductor comprising an output inductor of a transformer, the transformer configured to receive the first RF transmission as a differential signal.

6. The apparatus of claim 1, the inductor configured to receive the first RF transmission as a single-ended signal.

7. The apparatus of claim 1, the first RF transmission comprises a Bluetooth (BT) transmission and the second RF transmission comprises a wireless local area network (WLAN) transmission.

8. The apparatus of claim 1, the at least one switch comprising:
    a first switch connected to the first inductor terminal of the inductor and operable to selectively connect the first inductor terminal to ground, the inductor having a second inductor terminal connected to a second capacitor terminal of the capacitor;
    a second switch connected to the first inductor terminal and operable to selectively connect the first inductor terminal to the first capacitor terminal of the capacitor and to the antenna; and
    a third switch connected to the second inductor terminal and operable to selectively connect the second inductor terminal to the ground.

9. The apparatus of claim 8, the first, second and third switches configured to connect the inductor to the capacitor in series to form the matching network and in parallel to form the parallel resonant circuit.

10. The apparatus of claim 8, the first, second and third switches configured to connect the inductor to the capacitor in parallel to form the parallel resonant circuit when receiving a third RF transmission from the antenna.

11. The apparatus of claim 8, further comprising a controller configured to selectively open and close the first, second, and third switches based on a transmit mode signal.

12. A method comprising:
    receiving a transmission mode indicator;
    forming a matching network to transmit a first RF signal from an antenna, if a first transmission mode is indicated by the transmission mode indicator; and
    switching the matching network to a parallel resonant circuit to transmit a second RF signal from the antenna, if a second transmission mode is indicated by the transmission mode indicator, and wherein the first RF signal and the second RF signal are input to different nodes of the matching network.

13. The method of claim 12, the forming comprising connecting an inductor to a capacitor in series to form the matching network.

14. The method of claim 13, the switching comprising connecting the inductor to the capacitor in parallel to form the parallel resonant circuit.

15. The method of claim 12, further comprising utilizing the parallel resonant circuit to receive a third RF transmission from the antenna, if a third transmission mode is desired.

16. An apparatus comprising:
    means for receiving a transmission mode indicator;
    means for forming a matching network to transmit a first RF signal from an antenna, if a first transmission mode is indicated by the transmission mode indicator; and
    means for switching the matching network to a parallel resonant circuit to transmit a second RF signal from the antenna, if a second transmission mode is indicated by the transmission mode indicator, and wherein the first RF signal and the second RF signal are input to different nodes of the matching network.

17. The apparatus of claim 16, the means for forming comprising means for connecting an inductor to a capacitor in series to form the matching network.

18. The apparatus of claim 17, the means for switching comprising means for connecting the inductor to the capacitor in parallel to form the parallel resonant circuit.

19. The apparatus of claim 16, further comprising means for utilizing the parallel resonant circuit to receive a third RF transmission from the antenna, if a third transmission mode is indicated by the transmission mode indicator.

20. The apparatus of claim 16, the first RF transmission comprises a Bluetooth (BT) transmission and the second RF transmission comprises a wireless local area network (WLAN) transmission.

* * * * *